United States Patent [19]

Allensworth

[11] Patent Number: 4,605,987
[45] Date of Patent: Aug. 12, 1986

[54] METHOD OF CONTROLLING PRINTED CIRCUIT BOARD SOLDER FILLETS AND PRINTED CIRCUIT BOARDS INCLUDING SOLDER FILLET CONTROL PATTERNS

[75] Inventor: Dana R. Allensworth, New Canton, Ill.

[73] Assignee: Motorola, Inc., Schaumburg, Ill.

[21] Appl. No.: 564,131

[22] Filed: Dec. 22, 1983

[51] Int. Cl.⁴ .............................................. H05K 1/18
[52] U.S. Cl. ..................................... 361/403; 361/406
[58] Field of Search ................... 228/118, 179, 180 A, 228/180 R, 180.1, 180.2; 361/403, 406, 405

[56] References Cited

U.S. PATENT DOCUMENTS

| | | | |
|---|---|---|---|
| 3,214,827 | 11/1965 | Phohofsky | 174/68.5 X |
| 3,610,811 | 10/1971 | O'Keefe. | |
| 3,887,760 | 6/1975 | Krieger et al. | |
| 4,139,881 | 2/1979 | Shimizu et al. | |
| 4,164,778 | 8/1979 | Sawairi et al. | |
| 4,339,785 | 7/1982 | Ohsawa. | |
| 4,372,475 | 2/1983 | Goforth | 228/170 |
| 4,373,655 | 2/1983 | McKenzie, Jr. | |
| 4,413,309 | 11/1983 | Takahashi et al. | 228/180 A X |

OTHER PUBLICATIONS

R. W. Noth, Solder Bond, IBM Tech. Disc. Bull., V. 17 #8, Jan. 1975 p. 2214.

*Primary Examiner*—R. R. Kucia
*Attorney, Agent, or Firm*—Raymond A. Jenski; Donald B. Southard

[57] ABSTRACT

A solder fillet control pattern provides a predictable solder quality control for the components mounted on printed circuit boards. The pattern can include a plurality of solder fillet control boxes, which define the individual component locations. The pattern allows for a greatly increased component packing density on the boards without increasing soldering defects.

26 Claims, 9 Drawing Figures

METHOD OF CONTROLLING PRINTED CIRCUIT BOARD SOLDER FILLETS AND PRINTED CIRCUIT BOARDS INCLUDING SOLDER FILLET CONTROL PATTERNS

BACKGROUND OF THE INVENTION

Printed circuit borads (hereinafter boards) are the basic building blocks of any type of electronic product. Further, as can be noted with virtually any electronic product these products have been continually decreased in size without loss of any functions or with additional functions included. For example, in mobile applications, such as vehicle two way communication radios, the standard radio size has been 3 by 18 by 24 inches. These radios typically were accommodated in the dash, in the body, in the trunk, under the seat or in the floor board of the vehicles. The design criterion for newer radios now is on the order of 2½ by 7 by 12 inches, which allows for installation under the dash of modern automobiles.

Therefore, there is a need to develop smaller components to be mounted on the boards and a way of mounting the components on the boards in the highest packing density possible without causing or increasing soldering defects.

One development in smaller size components is the leadless component. These components presently include resistors, capacitors, potentiometers, trimmers, inductors, diodes, transistors and integrated circuits and can include other electronic components. further, some of the components include both leadless and lead type terminals. The leadless components are mounted on at least the solder side of the boards and generally are electrically connected by a molten soft solder process such as wave soldering or dipping, if desired.

The leadless components, especially the capacitors and resistors, generally are formed with a ceramic or alumina substrate material which result in fragile components. This is not a problem in the soldering process and would not be a problem, if the boards were not subjected to various stresses. The boards, however, generally are subjected to external bending stresses which can place excessive loads on the components causing cracks or outright fractures in the components and hence defective boards.

The stresses on the components can be controlled by controlling the solder fillets which are formed in the soldering process. One prior technique involves limiting the solder area on the board at each terminal of the component. This can be effective in utilizing two terminal components, but does not provide for an increased packing density of the components on the boards without increasing soldering defects; such as by bridging between adjacent components or component leads.

It is therefore a general object of the present invention to provide a solder fillet control pattern which provides a predictable control of the component solder quality.

It is a further object of the present invention to provide fillet control boxes to define the individual component locations on the board.

It also is an object of the present invention to increase the packing density of the components mounted on the boards without increasing soldering defects.

SUMMARY OF THE INVENTION

The invention provides a method controlling the solder fillets of the components on a printed circuit board which are attached to the boards by a molten soft solder process. The method includes affixing a solder resist control pattern around the surface mounted component locations to define the solder fillets, affixing the components to the board in the control pattern and subjecting the board and components to the molten soft solder process to provide a predictable solder quality control of the components.

The invention further provides a printed circuit board which has controlled solder fillets of the components which are attached to the board by a molten soft solder process. The board includes a solder resist control pattern affixed to the board around the surface mounted component locations to define the solder fillets and components affixed to the board in the pattern by the molten soft solder process to provide a predictable solder quality control of the components.

The invention also provides a printed circuit board subassembly which has means for controlling the solder fillets to be formed on the subassembly when the components are attached to the subassembly by a bolten soft solder process. The subassembly includes a solder resist control pattern affixed to the subassembly around the surface mounted component locations to define the solder fillets when the subassembly and components are subjected to the molten soft solder process to provide a predictable solder quality control of the components.

BRIEF DESCRIPTION OF THE DRAWINGS

The features of the present invention which are believed to be novel are set forth with particularity in the appended claims. The invention, together with further objects and advantages thereof, can be best understood by making reference to the following description taken in conjunction with the accompanying drawings, in the several figures of which like reference numerals identify identical elements, and wherein:

DESCRIPTION OF THE PREFERRED EMBODIMENTS

Figure 1:
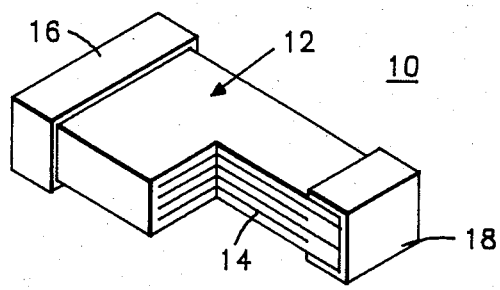
FIG. 1 is a partially sectional perspective view of one capacitor type of leadless component.

Referring now to FIG. 1, a leadless component here a capacitor 10 is best illustrated. The leadless component or chip 10 includes a ceramic body 12 which includes a plurality of inner electrodes 14. The body 12 includes a pair of leadless electrodes or termination strips 16 and 18. Other leadless components or chips are formed in a similar manner and some chips have both leadless and lead type termination electrodes. Generally, the chips are rectangular having a greater length between the strips 16 and 18 than along the length thereof.

Figure 2:
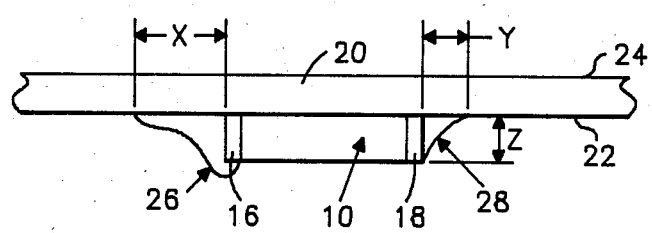
FIG. 2 is a partial side sectional view of a leadless component mounted on a board.

The chips 10 are mounted to a printed circuit board 20 as illustrated in FIG. 2. The term board as utilized herein, is intended to include any type of laminate or other type material which is utilized as a substrate or board for mounting electronic components thereon by any type of molten soft solder process, such as wave or dip processes.

The board 20 typically has a solder side 22 and a non-solder side 24. The chips 10 are mounted at least on the solder side 22 of the board 20 and can also be mounted on the non-solder side 24. The non-solder side 24 typically has the conventional lead type components mounted thereon, which can also utilize the invention as described hereinafter. The chips 10 are mounted directly against the solder side 22 of the board 20 and hence can be called surface mounted components or devices as opposed to lead type components.

The chips are first generally affixed to the solder side 22, as by an adhesive, and then are subjected to the solder process. A prior art excess solder fillet 26 is illustrated on one end of the chip connecting a lead or runner (not illustrated) on the solder side 22 to the termination strip 16. The fillet 26 has an uncontrolled dimension X which allows an excess of solder to build up and to extend over and/or beyond the edge of the termination strip 16. When the board 20 is subjected to a flexing stress, the fillet 26 is too large to flex and hence transmits the stress to the chip 10 which can crack or fracture causing a board defect.

A proper fillet 28 of the invention has a controlled distance y. The distance y is selected to be no less than the thickness or width z of the chip 10. Therefore, the fillet 28 is restricted to an angle of 45° or less, defined by the dimensions y and z. The fillet 28 will flex with the flexing stress applied to the board 20 and hence will protect the chip 10 from developing cracks or other defects.

Figure 3:
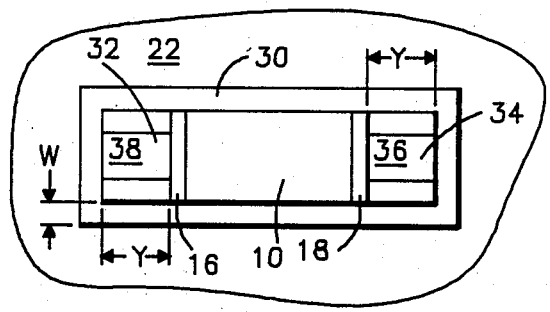
FIG. 3 is a top view of one embodiment of a solder fillet control pattern of the invention.

Referring now to FIG. 3, one embodiment of a solder fillet control pattern of the invention is a fillet control box 30 affixed to the solder side 22 of the board 20. The board 20 is processed conventionally up to the point of placing the components or chips 10 thereon. The board 20 will have the general lead and component pad pattern therein including a pair of leads or runners 32 and 34. The leads 32 and 34 can extend beyond the box 30 and are screened by a conventional process. The solder control pattern of the invention includes the additional step of adding a solder resist pattern or plurality of boxes 30 to the conventional screening pattern.

The box 30 is generally defind by the shape of the chip 10 and by the distance y from the strips 16 and 18. As illustrated in FIG. 3, for high density applications, the sides of the chip 10 define the width of the box 30. If the absolute highest density is not desired, then the inside width of the box 30 can be wider than the chip 10, which provides a greater tolerance for placement of the chips 10. The width "w" of the lines of the box are preferably at least ½ mm wide and can be wider. Thus the control box 30 defines a component location for the chip 10 and the distances y, the leads 32 and 34 and the box 30 define a pair of solder fillets 36 and 38. The box 30 provides a predictable quality control of the solder fillets of the chips 10.

Figure 4:
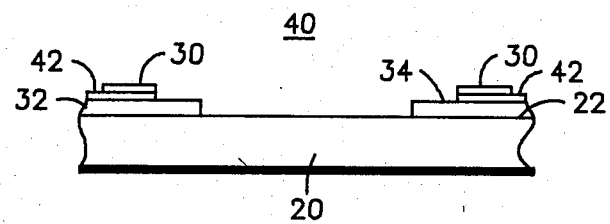
FIG. 4 is a partial side sectional view of one mounting embodiment of the pattern of FIG. 3.

FIG. 4 is a side view of one mounting embodiment 40 of the box 30. The leads 32 and 34 are generally screened by a layer of solder resist 42, which is terminated to leave the ends of the leads 32 and 34 exposed for soldering the chip 10 thereto. The control box 30 is added on top of the resist 42 in the embodiment 40. The dimensions illustrated in FIG. 4, as well as the other Figures are not drawn to a particular scale, but are merely illustrative. The box 30 is most preferably formed of a resist material which contrasts in color with the resist 42 to define the pattern and to aid in placement of the chips 10.

Figure 5:
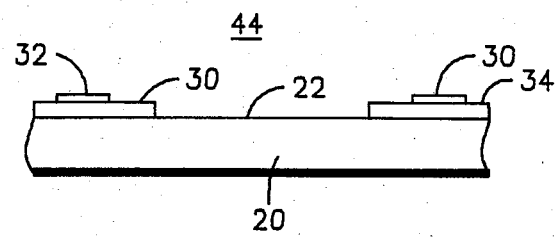
FIG. 5 is a partial side sectional view of a second mounting embodiment of the pattern of FIG. 3.

FIG. 5 is a side view of a second mounting embodiment 44 of the box 30. In this embodiment, the solder resist 42 is not utilized or has been removed from the component location area. The box 30 is formed directly on top of the leads 32 and 34, again leaving the ends exposed for soldering. Again, the boxes 30 preferably would be of a color which contrasts with the underlying surface.

Figure 6:
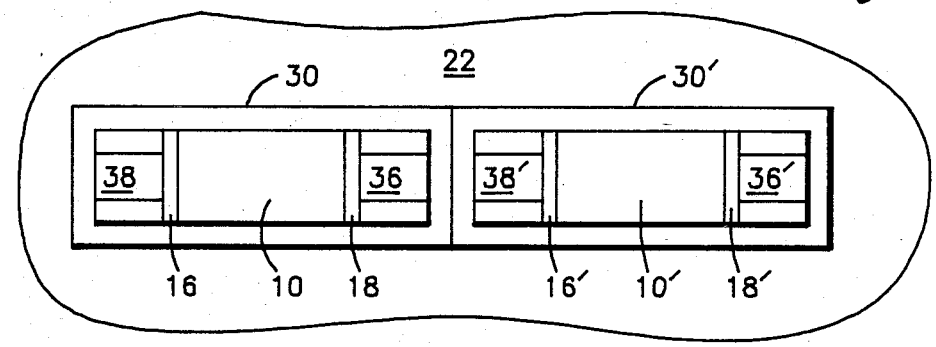
FIG. 6 is a top view of another embodiment of a solder fillet control pattern of the invention for end to end component locations.

FIG. 6 illustrates a pair of components 10 and 10' in end to end locations. The control boxes 30 and 30' have been chosen to abut one another; however, they can also overlap one another as illustrated in FIG. 7.

Figure 7:
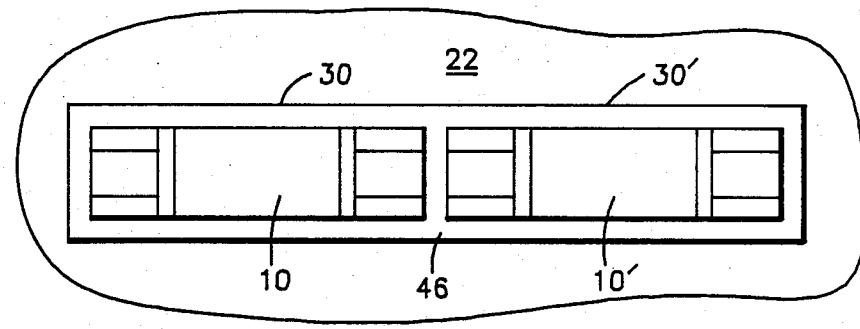
FIG. 7 is a top view of an alternate embodiment of the invention for the component locations of FIG. 6.

In FIG. 7, the boxes 30 and 30' overlap at a junction 46 common therebetween. The solder control pattern of the invention can then be one unitary pattern as illustrated in FIG. 7 or a separate plurality of control boxes as illustrated in FIG. 6.

Figure 8:
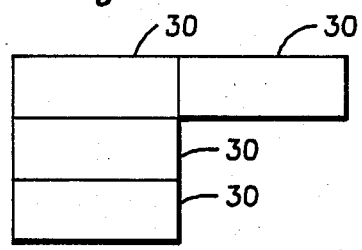
FIG. 8 is a top view of an embodiment of the invention illustrating the enhanced packing density of the invention.

The arrangement of the solder control pattern of the invention also facilitates an increased component packing density as illustrated diagramatically in FIG. 8. The solder control boxes 30 totally define the possible component locations in two dimensions. The boxes 30 also prevent solder bridging between adjacent components. Therefore, when designing a board utilizing the solder control pattern and boxes of the invention, the component locations are clearly mapped which facilitates an error free board design. Further, the contrasting boxes 30 also aid in aligning, inserting and affixing the components to the board before the soldering process.

Figure 9:
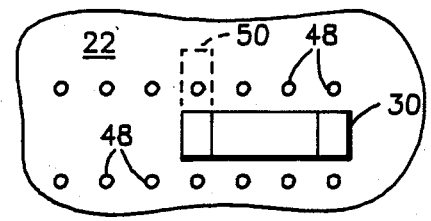
FIG. 9 is a top view of an embodiment of the invention located on the opposite side of the board from an integrated circuit component illustrating the enhanced packing density of the invention.

The solder control pattern of the invention can also be utilized in conjunction with lead type electronic components as illustrated in FIG. 9. A plurality of the leads or pins 48 of a lead type component (not illustrated) mounted on the non-solder side 24 of the board 20 extend through the solder side 22 of the board 20. Utilizing the solder control box 30 of the invention, the chip 10 can be mounted opposite the lead type component between the pins 48 thereof. On the opposite side 24 of the board 20, each of the leads 48 also can utilize solder fillet control boxes 50, one of which is illustrated in phantom, to prevent bridging between adjacent leads 48 during the soldering process.

The present invention therefore provides an improved method of locating and soldering components to the boards. The solder fillet control pattern defines both the component locations and provides for predictable solder quality control. The component locations are best defined by utilizing a pattern which contrasts with the underlying surface color. The density of components on the boards can be greatly increased without any increase in soldering defects. In general, conventional techniques allow only 8 to 10 components per square inch of the boards (utilizing both top and bottom surfaces 22 and 24). The pattern of the invention allows as many as 40 components of the same general size and configuration as utilized in the conventional techniques, to be mounted per square inch of the boards (utilizing both sides thereof).

I claim:

1. A printed circuit board having controlled solder fillets, on said board having a number of surface mounted components locations, which components having leadless electrodes of a predetermined height z are attached by a solder process, said board comprising:

a solder resist control pattern affixed on said board around at least some of said surface mounted component locations to define the solder fillets such that the maximum distance each said solder fillet extends from said leadless electrode is not less than z; and means for controlling solder fillet width to be substantially uniform over the maximum distance each said solder fillet extends from said leadless electrode; whereby at least some of said components affixed to said board in said solder resist control pattern by the solder process are provided a predictable solder quality.

2. The board as defined in claim 1 wherein:
    said pattern is formed of a color contrasting with the surface thereunder to define said locations.

3. The board as defined in claim 1 wherein:
    said pattern includes a plurality of individual fillet control boxes, at least one box defining said pattern around each of said defined component locations.

4. The board as defined in claim 3 wherein:
    said boxes define substantially all of said component locations to facilitate the board design and eliminate defects.

5. The board as defined in claim 4 wherein:
    said boxes are rectangular in shape and overlap at least some of one another when said defined component locations are aligned end to end.

6. The board as defined in claim 4 wherein:
    said boxes are located adjacent one another as closely as possible on both sides of said board to increase the component density on said board without increasing defects.

7. The board as defined in claim 1 wherein:
    said board includes a plurality of leadless component and a plurality of lead type component mounting locations; and
    said pattern is affixed on said board around at least some of said leadless and some of some lead type component mounting locations.

8. The board as defined in claim 7 wherein:
    said pattern includes a plurality of individual fillet control boxes, at least one box defining said pattern around each of said defined component locations.

9. The board as defined in claim 8 wherein:
    said boxes define substantially all of said component locations to facilitate the board design and eliminate defects.

10. The board as defined in claim 9 wherein:
    said boxes are rectangular in shape and overlap at least some of one another when said defined component locations are aligned end to end.

11. The board as defined in claim 9 wherein:
    said boxes are located adjacent one another as closely as possible on both sides of said board to increase the component density on said board without increasing defects.

12. A printed circuit board having controlled solder fillets as described in claim 1, wherein said solder fillet is controlled such that the solder mass decreases with increasing distance from the leadless electrode.

13. A printed circuit board having controlled solder fillets in claim 1, wherein said solder fillets are shared by components having leadless electrodes and components having leads.

14. A printed circuit subassembly having a means for controlling the solder fillets to be formed on said subassembly, said subassembly having a number of surface mounted component locations, which components having leadless electrodes of a predetermined height z are to be attached by a solder process, said subassembly control means comprising:

a solder resist control pattern affixed on said subassembly around at least some of said surface mounted component locations to define the solder fillets of substantially uniform width such that the maximum distance each said solder fillet extends from said leadless electrodes is not less than z when said subassembly and components are subjected to a solder process to provide a predictable control of the solder quality of said components on said subassembly.

15. The control means as defined in claim 14 wherein:
    said pattern is formed of a color contrasting with the surface thereunder to define said locations.

16. The control means as defined in claim 14 wherein:
    said pattern includes a plurality of individual fillet control boxes, at least one box defining said pattern around each of said defined component locations.

17. The control means as defined in claim 16 wherein:
    said boxes define substantially all of said component locations to facilitate the board design and eliminate defects.

18. The control means as defined in claim 17 wherein:
    said boxes are rectangular in shape and overlap at least some of one another when said defined component locations are aligned end to end.

19. The control means as defined in claim 17 wherein:
    said boxes are located adjacent one another as closely as possible on both sides of said subassembly to increase the component density on said subassembly without increasing defects.

20. The control means as defined in claim 14 wherein:
    said subassembly includes a plurality of leadless component and a plurality of lead type component mounting locations; and
    said pattern is affixed on said subassembly around at least some of said leadless and some of some lead type component mounting locations.

21. The control means as defined in claim 20 wherein:
    said pattern includes a plurality of individual fillet control boxes, at least one box defining said pattern around each of said defined component locations.

22. The control means as defined in claim 21 wherein:
    said boxes define substantially all of said component locations to facilitate the board design and eliminate defects.

23. The control means as defined in claim 22 wherein:
    said boxes are rectangular in shape and overlap at least some of one another when said defined component locations are algnd end to end.

24. The control means as defined in claim 22 wherein:

said boxes are located adjacent one another as closely as possible on both sides of said subassembly to increase the component density on said subassembly without increasing defects.

25. A printed circuit board subassembly having a means for controlling the solder fillets as described in claim 14, wherein said solder fillet is controlled such that the solder mass decreases with increasing distance from the leadless electrode.

26. A printed circuit board subassembly having a means for controlling the solder fillets as described in claim 14, wherein said solder fillets are shared by components having leadless electrodes and components having leads.

* * * * *